(12) United States Patent
Ito (10) Patent No.: US 11,058,041 B2
(45) Date of Patent: Jul. 6, 2021

(54) COMPONENT MOUNTER AND MOUNTING HEAD

(71) Applicant: FUJI CORPORATION, Chiryu (JP)

(72) Inventor: Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 94 days.

(21) Appl. No.: 16/496,794

(22) PCT Filed: Mar. 31, 2017

(86) PCT No.: PCT/JP2017/013553
§ 371 (c)(1),
(2) Date: Sep. 23, 2019

(87) PCT Pub. No.: WO2018/179317
PCT Pub. Date: Oct. 4, 2018

(65) Prior Publication Data
US 2020/0383251 A1 Dec. 3, 2020

(51) Int. Cl.
*H05K 13/04* (2006.01)
*B25J 15/06* (2006.01)
(Continued)

(52) U.S. Cl.
CPC ...... *H05K 13/0409* (2018.08); *B25J 15/0641* (2013.01); *B65G 47/91* (2013.01); *F01L 1/22* (2013.01); *G05D 7/0113* (2013.01)

(58) Field of Classification Search
None
See application file for complete search history.

(56) References Cited

U.S. PATENT DOCUMENTS 9,109,986 B2 * 8/2015 Nishiyama ......... H05K 13/0413
10,440,869 B2 * 10/2019 Kawaguchi ........ H05K 13/0409
(Continued)

FOREIGN PATENT DOCUMENTS

CN   1642267 A     10/2006
CN   1842267 A  *  10/2006
(Continued)

OTHER PUBLICATIONS

International Search Report dated Jun. 20, 2017 in PCT/JP2017/013553 filed Mar. 31, 2017.

*Primary Examiner* — Gerald McClain
(74) *Attorney, Agent, or Firm* — Oblon, McClelland, Maier & Neustadt, L.L.P.

(57) ABSTRACT

There is provided a component mounter for mounting a component on a mounting target object, including: a mounting head comprising a base section having, in the interior thereof, a first gas passage and a second gas passage that does not communicate with the first gas passage; a lifting and lowering mechanism for lifting and lowering the base section; a suction nozzle having a nozzle section disposed below the base section and configured to be lifted up and lowered, as the base section is lifted up and lowered, to pick up the component through a negative pressure supplied to the first gas passage; a biasing section for biasing the nozzle section downwards while permitting the nozzle section to be pushed in towards the base section; and a valve for switching between presence and absence of communication between the second gas passage and the outside depending on whether a push-in amount of the nozzle section has not yet reached or reached a predetermined value; and a detecting device for detecting at least one of a flow rate or a pressure of gas flowing through the second gas passage.

3 Claims, 6 Drawing Sheets

(51) Int. Cl.
*B65G 47/91* (2006.01)
*F01L 1/22* (2006.01)
*G05D 7/01* (2006.01)

(56) References Cited

U.S. PATENT DOCUMENTS

2006/0053624 A1  3/2006  Maeda et al.
2014/0353995 A1  12/2014  Nishiyama

FOREIGN PATENT DOCUMENTS

| CN | 105704333 A | 7/2016 | |
| EP | 2806718 A1 * | 11/2014 | .......... B25J 15/0641 |
| JP | 2012-69836 A | 4/2012 | |
| WO | WO 2013/108390 A1 | 7/2013 | |
| WO | WO-2013108390 A1 * | 7/2013 | ............. G01N 19/00 |
| WO | WO 2015/045065 A1 | 4/2015 | |

* cited by examiner

FIG. 6

COMPONENT MOUNTER AND MOUNTING HEAD

TECHNICAL FIELD

The present disclosure relates to a component mounter and a mounting head.

BACKGROUND ART

Conventionally, in a component mounter in which components are mounted on a mounting target such as a board by suction, a component mounter is known in which a nozzle section is pushed into a nozzle base section side against a biasing force of a spring when the suction nozzle is in a lowering operation (for example, Patent Literature 1). As a result, this component mounter can alleviate the impact on a component during the lowering operation of the suction nozzle, and can mount the component by lightly pressing the component to the board.

The component mounter of Patent Literature 1 is configured so that a negative pressure is supplied to an air passage in the nozzle section to pick up a component to the nozzle section by suction. The nozzle base section and the nozzle section are provided with leak holes for switching the air passage to a state of communicating with the outside of the nozzle base section when the push-in amount of the nozzle section reaches a predetermined value. Thus, by detecting a flow rate or a pressure of air at the time of the lowering operation of the suction nozzle and monitoring the presence or absence of leakage of air, it is possible to determine whether the push-in amount of the nozzle section has reached the predetermined value.

PATENT LITERATURE

Patent Literature 1: WO 2015/045065 A1

BRIEF SUMMARY

Technical Problem

However, in the component mounter described in Patent Literature 1, whether the push-in amount of the nozzle section has reached the predetermined value is determined by using the air passage used for picking up a component. For this reason, the flow rate or pressure of air at the time of leakage resulting when the push-in amount reaches the predetermined value may be changed because the state of the nozzle section changes due to, for example, the presence or absence of picking up a component or the type of a component picked up. Therefore, in some cases, whether the push-in amount of the nozzle section has reached the predetermined value cannot be determined accurately.

The present disclosure has been made in order to solve the above-mentioned problems, and a main object thereof is to determine whether the push-in amount of a nozzle section has reached a predetermined amount more accurately.

Solution to Problem

The present disclosure employs the following means in order to achieve the main object described above.

According to the present disclosure, there is provided a component mounter for mounting a component on a mounting target object, including:

a mounting head including a base section having, in the interior thereof, a first gas passage and a second gas passage that does not communicate with the first gas passage;

a lifting and lowering mechanism for lifting and lowering the base section;

a suction nozzle having a nozzle section disposed below the base section and configured to be lifted up and lowered, as the base section is lifted up and lowered, to pick up the component through a negative pressure supplied to the first gas passage;

a biasing section for biasing the nozzle section downwards while permitting the nozzle section to be pushed in towards the base section; and a valve for switching between presence and absence of communication between the second gas passage and the outside depending on whether a push-in amount of the nozzle section has not yet reached or reached a predetermined value; and a detecting device for detecting at least one of a flow rate or a pressure of gas flowing through the second gas passage.

In this component mounter, for example, in picking up a component, or in mounting a component, when the base section is lowered by the lifting and lowering mechanism, the nozzle section is also lowered along with the lowering of the base section. In addition, when the base section continues to go down with the nozzle section or the component picked up by the nozzle section kept in abutment with another member, the nozzle section is pushed in towards the base section against the biasing force of the biasing section. The presence and absence of the communication between the second gas passage and the outside is then switched depending on whether the push-in amount of the nozzle section has reached the predetermined amount. As a result, by detecting at least one of the flow rate and the pressure of the gas flowing through the second gas passage with the detecting device, the component mounter can determine whether the push-in amount has reached the predetermined amount. Moreover, the second gas passage used for this determination does not communicate with the first gas passage to which the negative pressure is supplied to pick up a component. Due to this, even if the state of the nozzle section differs, for example, the nozzle section holds or does not hold a component, or the types of components held to the nozzle section are changed, the second gas passage is hardly affected. Therefore, in this component mounter, whether the push-in amount of the nozzle section has reached the predetermined amount can be determined more accurately.

According to the present disclosure, there is provided a mounting head for use in a component mounter for mounting a component on a mounting target object, the mounting head including:

a base section having, in the interior thereof, a first gas passage and a second gas passage that does not communicate with the first gas passage;

a lifting and lowering mechanism for lifting and lowering the base section;

a suction nozzle having a nozzle section disposed below the base section and configured to be lifted up and lowered, as the base section is lifted up and lowered, to pick up the component through a negative pressure supplied to the first gas passage;

a biasing section for biasing the nozzle section downwards while permitting the nozzle section to be pushed in towards the base section; and a valve for switching between presence and absence of communication between the second gas passage and the outside depending on whether a push-in amount of the nozzle section has not yet reached or reached a predetermined value.

In this mounting head, similar to the component mounter described above, the second gas passage does not communicate with the first gas passage. Due to this, in this mounting head, whether the push-in amount of the nozzle section has reached the predetermined amount can be determined more accurately.

DESCRIPTION OF EMBODIMENT

Figure 1:
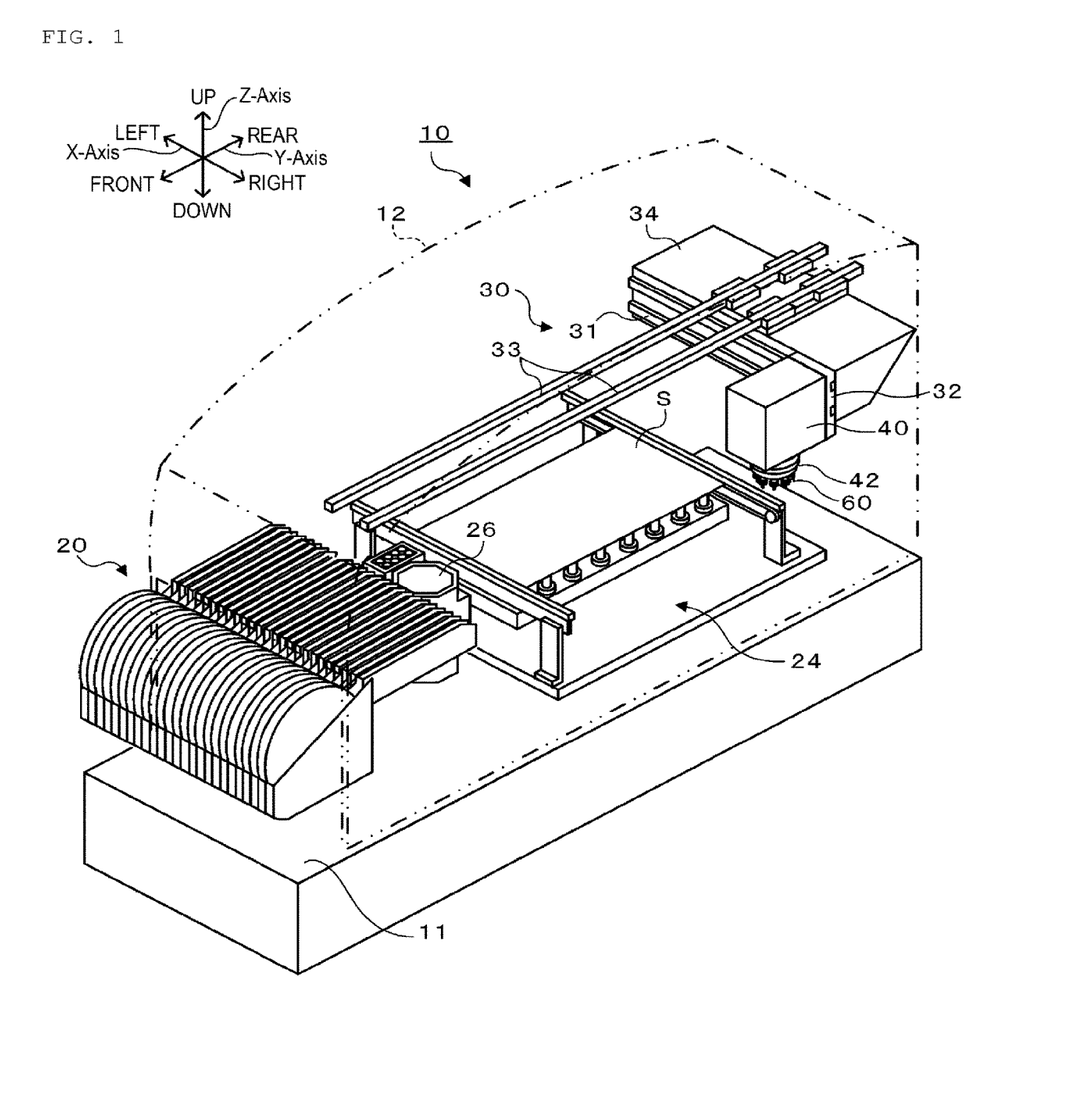
FIG. 1 is a diagram showing schematically the configuration of component mounter 10 according to the present embodiment.
Figure 2:
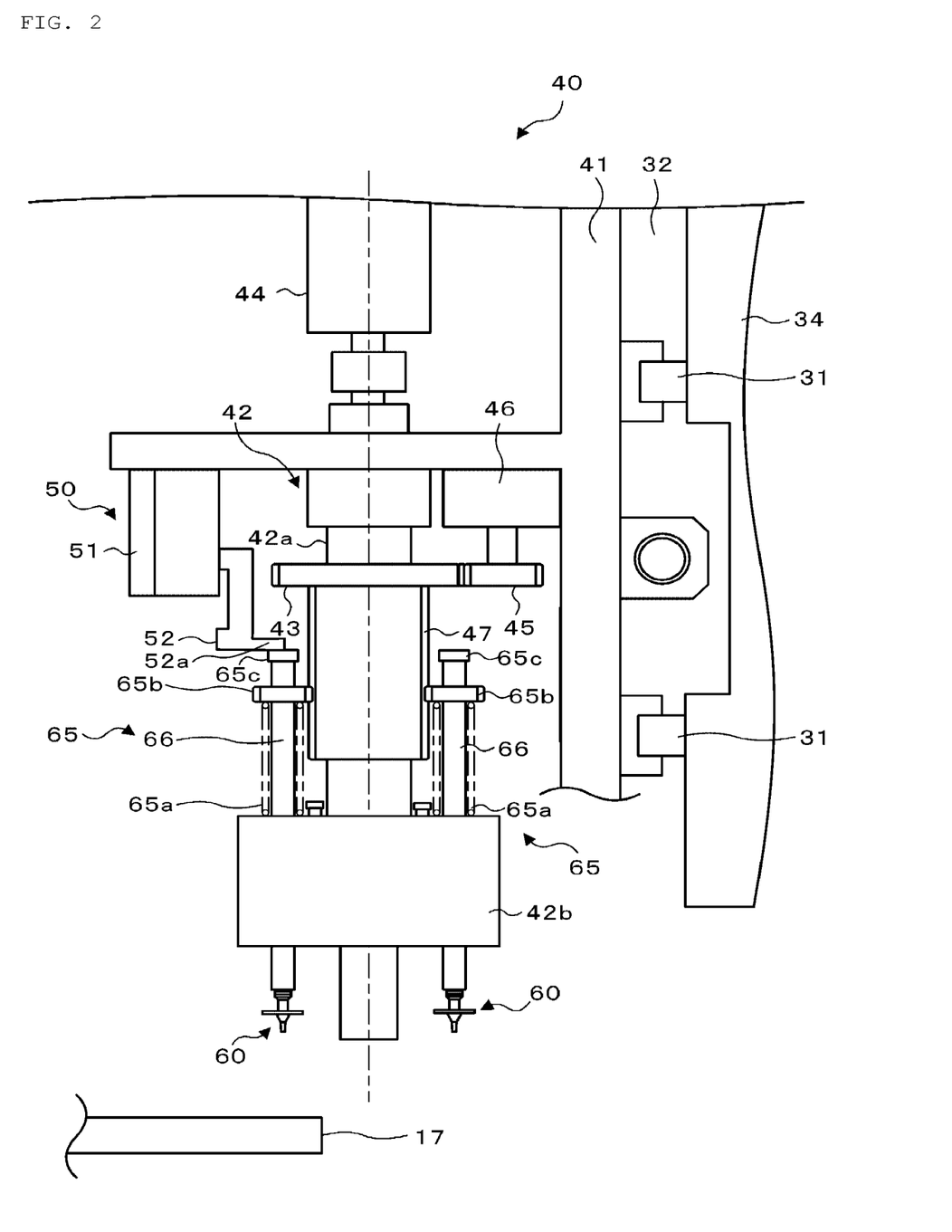
FIG. 2 is a diagram showing schematically the configuration of mounting head 40.
Figure 3:
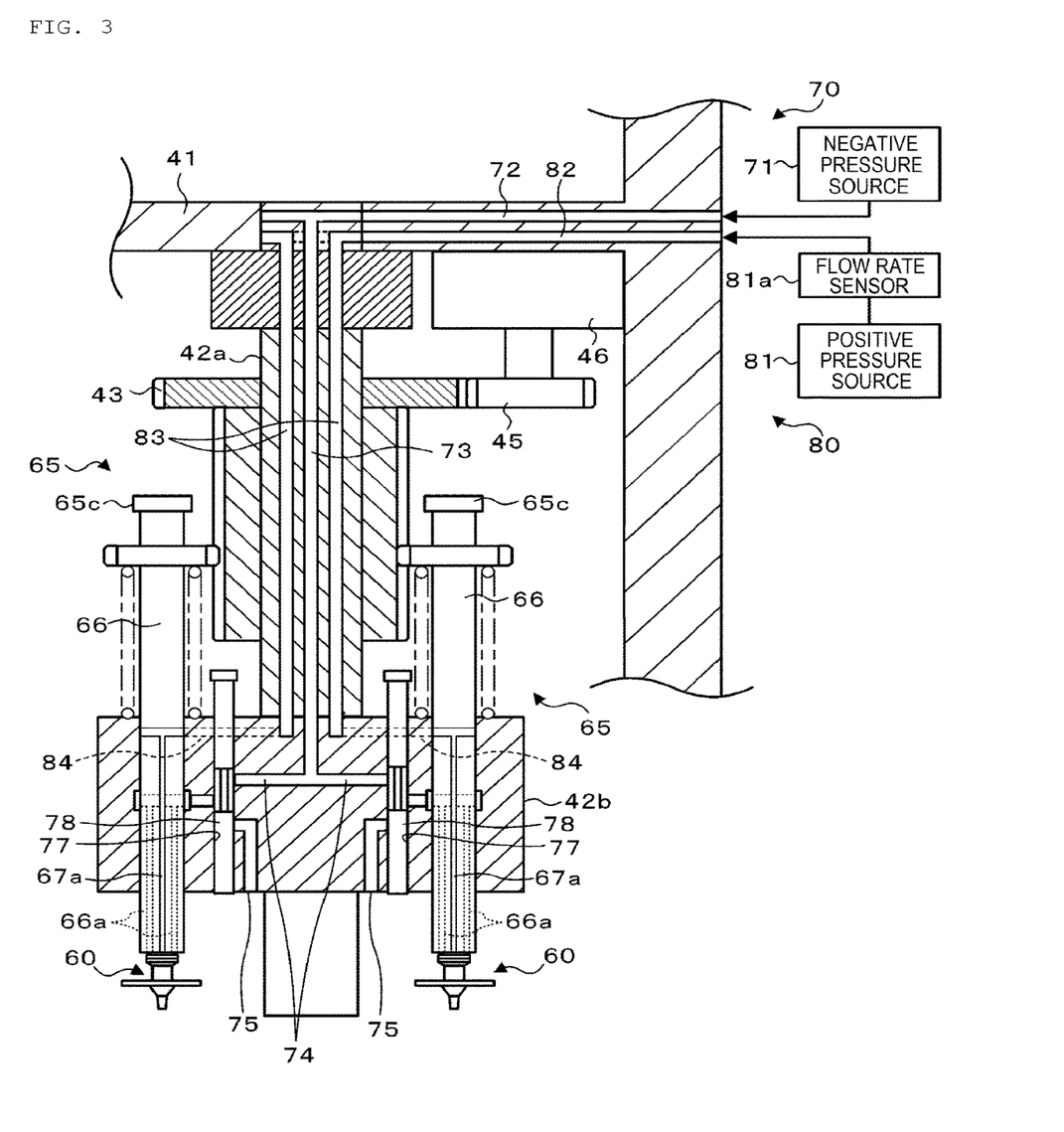
FIG. 3 is a diagram showing schematically the configurations of negative pressure supply device 70 and positive pressure supply device 80.
Figure 4A:
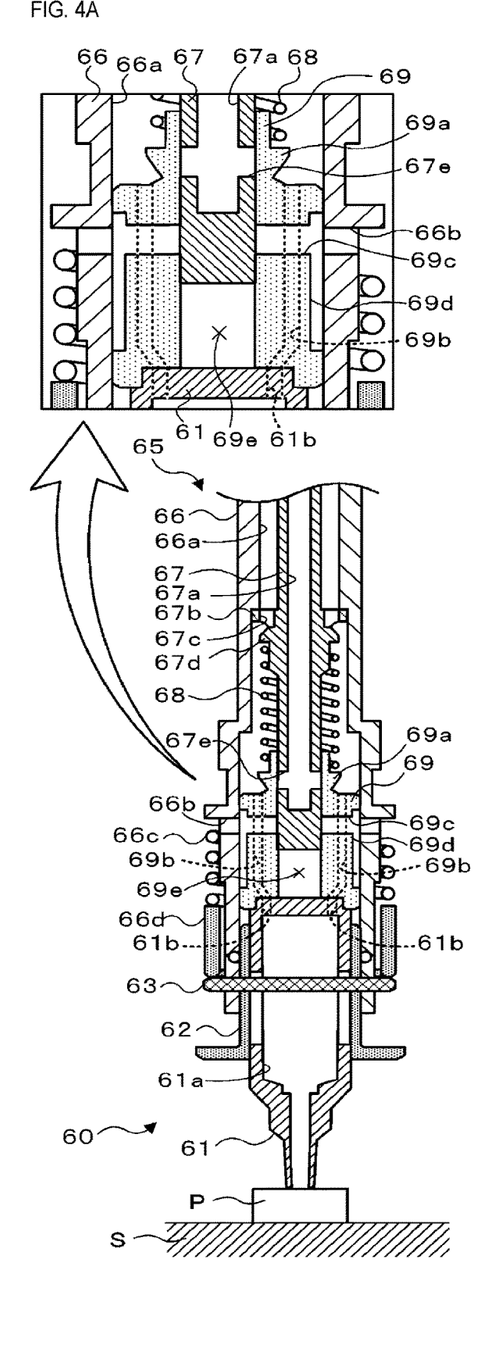
FIG. 4 is a diagram showing how valve 69 switches between presence and absence of a communication between second gas passage 67a and the exterior.
Figure 4B:
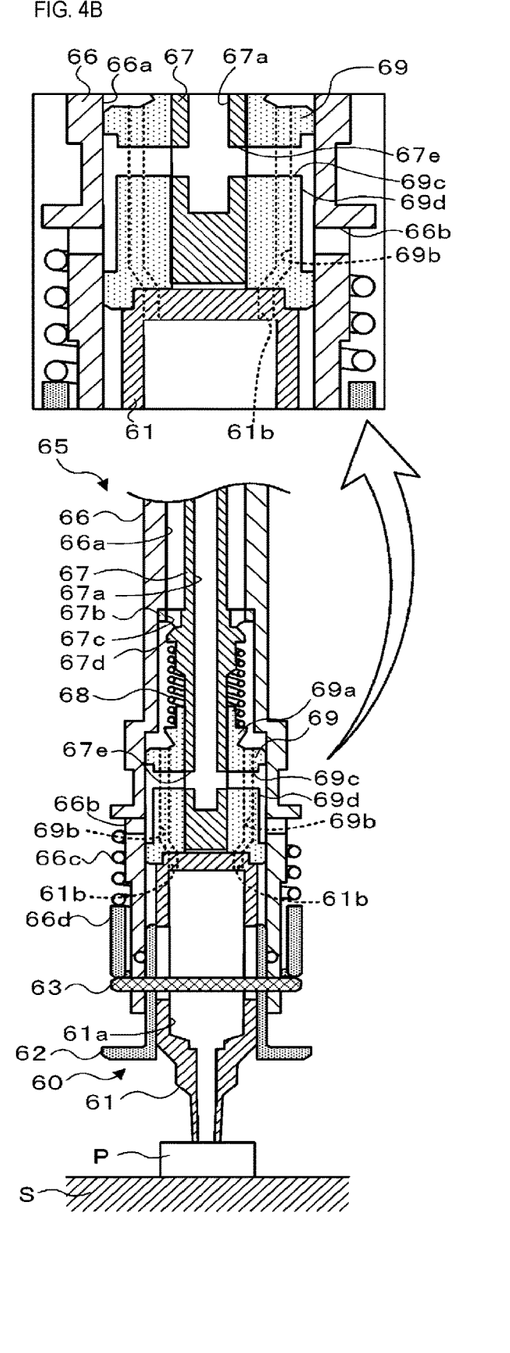
Figure 5:
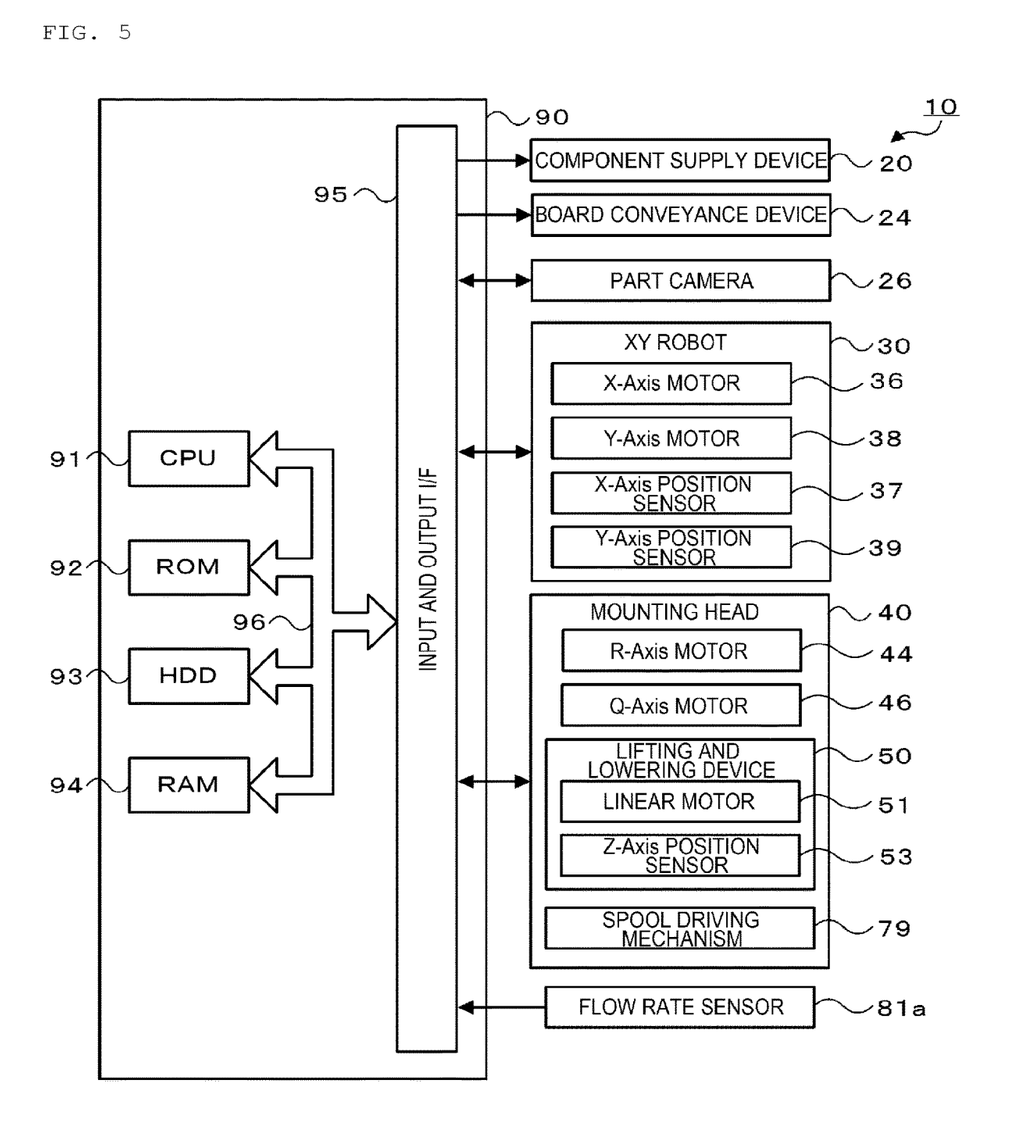
FIG. 5 is a diagram showing electrical connections of control device 90.

An embodiment of a component mounter and a mounting head of the present disclosure will be described below by reference to drawings. FIG. 1 is a diagram schematically showing the configuration of component mounter 10 of the present embodiment, FIG. 2 is a diagram schematically showing the configuration of mounting head 40, FIG. 3 is a diagram schematically showing the configurations of negative pressure supply device 70 and positive pressure supply device 80, FIG. 4 is a diagram showing a state in which valve 69 switches between presence and absence of a communication between second gas passage 67a and the exterior, and FIG. 5 is a diagram showing electrical connections of control device 90. Note that in FIG. 1, a left-right direction denotes an X-axis direction, a front (a near side) and rear (a far side) direction or a front-rear direction denotes a Y-axis direction, and an up-down direction denotes a Z-axis direction.

As shown in FIG. 1, component mounter 10 includes base 11, housing 12 supported by base 11, reference member 17 (see FIG. 2) on which a reference surface serving as a reference of height is formed, component supply device 20 that supplies a component P to a component supply position, and board conveyance device 24 that conveys board S (an example of a mounting target). In addition, component mounter 10 includes mounting head 40 that picks up component P supplied to the component supply position and mounts component P in question on board S, XY robot 30 that moves mounting head 40 in X- and Y-axis directions, and control device 90 (refer to FIG. 5) that controls all the devices. In addition, component mounter 10 includes, in addition to those described above, part camera 26 for imaging the orientation of component P held by mounting head 40, a mark camera (not shown) provided on mounting head 40 for reading a positioning reference mark attached to board S, and the like.

Component supply device 20 is configured as a tape feeder for supplying components P by feeding a tape on which components P are housed in housing sections formed at predetermined intervals.

As shown in FIG. 1, XY robot 30 includes a pair of left and right Y-axis guide rails 33 provided along the front-rear direction (Y-axis direction) on an upper stage section of housing 12, Y-axis slider 34 spanning the pair of left and right Y-axis guide rails 33 and moveable along Y-axis guide rails 33, X-axis guide rails 31 provided along the left and right direction (X-axis direction) on a side surface of Y-axis slider 34, and X-axis slider 32 movable along X-axis guide rails 31. X-axis slider 32 is movable by driving X-axis motor 36 (refer to FIG. 5), and Y-axis slider 34 is movable by driving a Y-axis motor 38 (refer to FIG. 5). Mounting head 40 is attached to X-axis slider 32, and mounting head 40 can be moved to any position on an XY plane by control device 90 driving and controlling XY robot 30 (X-axis motor 36 and Y-axis motor 38).

As shown in FIG. 2 or FIG. 3, mounting head 40 includes head main body 42 in which multiple nozzle holders 65 (only two shown in FIGS. 2 and 3) are arranged at predetermined angular intervals (for example, 30 degrees) in a circumferential direction concentrically with a rotation shaft, and pickup nozzles 60 each detachably attached to a lower end portion of each nozzle holder 65. Mounting head 40 includes R-axis motor 44 that rotates head main body 42 to revolve multiple nozzle holders 65, Q-axis motor 46 that causes multiple nozzle holders 65 to rotate on their axes, and lifting and lowering device 50 that lifts up and lowers nozzle holders 65. In addition, mounting head 40 includes negative pressure supply device 70 for supplying a negative pressure to nozzle section 61, and positive pressure supply device 80 for supplying a positive pressure to nozzle holders 65.

As shown in FIG. 2 or FIG. 3, head main body 42 includes frame 41 attached to X-axis slider 32, shaft section 42a rotatably supported by frame 41, and holder holding section 42b formed into a cylindrical shape having a larger diameter than that of shaft section 42a and configured to hold multiple nozzle holders 65 movably in the Z-axis direction. When R-axis motor 44 is driven, shaft section 42a and holder holding section 42b rotate, causing multiple nozzle holders 65 to revolve. Head main body 42 has gear 43 lying concentric with shaft section 42a and supported rotatable relative to shaft section 42a, and gear 47 configured to rotate in conjunction with rotation of gear 43. Gear 43 meshes with gear 45 attached to a rotation shaft of Q-axis motor 46, and gear 47 meshes with gear 65a attached to each nozzle holder 65. When Q-axis motor 46 is driven, each nozzle holders 65 and suction nozzle 60 mounted on each nozzle holders 65 rotates (rotates on its axis) in the same rotational direction by the same rotation amount (rotation angle). Spring 65a is disposed between a lower surface of gear 65b and an upper surface of holder holding section 42b. Spring 65a biases nozzle holder 65 upwards in the Z-axis direction.

Nozzle holder 65 is configured as a cylindrical member extending in the Z-axis direction, and as shown in FIG. 3, first gas passage 66a and second gas passage 67a are formed in the interior thereof. As shown in FIG. 2 or 3, nozzle holder 65 includes horizontal section 65c extending in a radial direction that is formed at the upper end portion thereof.

As shown in FIG. 2, lifting and lowering device 50 includes linear motor 51 and Z-axis slider 52 which can be lifted up and lowered in the Z-axis direction by driving of linear motor 51. Z-axis slider 52 is formed with engagement section 52a that can be brought into engagement (here, abutment) with horizontal section 65c provided on nozzle holder 65. Engagement section 52a engages with horizontal section 65c of nozzle holder 65 positioned in a predetermined lifting and lowering position in the multiple nozzle holders 65. When Z-axis slider 52 is lifted up or lowered with engagement section 52a kept in engagement with horizontal section 65c, nozzle holder 65 positioned in a lifting and lowering position is lifted up or lowered in conjunction with the movement of Z-axis slider 52. Since suction nozzle 60 is attached to nozzle holder 65, suction nozzle 60 is also lifted up or goes down as nozzle holder 65 is lifted up or goes down. When multiple nozzle holders 65 are caused to revolve by R-axis motor 44, nozzle holder 65 positioned in a lifting and lowering position is replaced with another one coming thereto as a result of the revolution of nozzle holders 65.

Negative pressure supply device 70 is a device for independently supplying a negative pressure from the same negative pressure source 71 to multiple suction nozzles 60 mounted individually on multiple nozzle holders 65. As shown in FIG. 3, negative pressure supply device 70 includes negative pressure source 71 such as a vacuum pump, frame passage 72, head passage 73, negative pressure introduction passage 74, atmosphere introduction passage 75, spool hole 77, spool 78, and spool driving mechanism 79 (refer to FIG. 5). Frame passage 72 is formed in frame 41 of mounting head 40 and is connected to negative pressure source 71. Head passage 73 communicates with frame passage 72 and extends along a central axis of mounting head 40. Negative pressure introduction passage 74 communicates with head passage 73, and multiple negative pressure introduction passages 74 are formed in such a manner as to extend radially from a center axis of holder holding section 42b. As to atmosphere introduction passage 75, multiple atmosphere introduction passages 74 are formed in such a manner as to communicate with a positive pressure source (here, the atmosphere).

Spool 78 is a switching valve for selectively establishing communication between first gas passage 66a provided in each of multiple nozzle holders 65 and either of corresponding negative pressure introduction passage 74 and atmosphere introduction passage 75. Although it will be described later in detail, first gas passage 66a communicates with a suction port at the distal end of nozzle section 61 of suction nozzle 60. As shown in FIG. 3, spool 78 is a cylindrical member that is inserted into a corresponding one of spool holes 77 formed in holder holding section 42b in such a manner as to correspond to multiple nozzle holders 65. In this spool 78, a substantially central portion is diametrically contracted, and a circumference of the diametrically contracted portion in the space of spool hole 77 constitutes a path for a negative pressure supplied from negative pressure source 71. Spool 78 establishes communication between first gas passage 66a and negative pressure passage 74 and cuts off communication between first gas passage 66a and atmosphere introduction passage 75 in a state where spool 78 moves upwards (a state shown in FIG. 3). On the other hand, in a state where spool 78 moves downwards, spool 78 cuts off the communication between first gas passage 66a and negative pressure introduction passage 74 while establishing communication between first gas passage 66a and atmosphere introduction passage 75. Spool driving mechanism 79 outputs a driving force to fluctuate spool 78, causing spool 78 to switch communications between communication of first gas passage 66a with negative pressure introduction passage 74 and communication of first gas passage 66a with atmosphere introduction passage 75. Spool driving mechanism 79 may be, for example, a mechanism for fluctuating a lever (not shown) attached to spool 78.

Positive pressure supply device 80 is a device for supplying a positive pressure to second gas passage 67a provided in each of multiple nozzle holders 65. As shown in FIG. 3, positive pressure supply device 80 includes positive pressure source 81 such as a compressor, flow rate sensor 81a, frame passage 82, head passage 83, and positive pressure introduction passage 84. Flow rate sensor 81a is connected to positive pressure source 81 and detects a flow rate of gas (here, air) supplied from positive pressure source 81 and flowing through second gas passage 67a. Frame passage 82 is formed in a different position from frame passage 72 in frame 41 of mounting head 40, and is connected to flow rate sensor 81a and positive pressure source 81. Head passage 83 communicates with frame passage 82 and is formed in such a manner as to extend along a center axis direction of mounting head 40. Head passage 83 has a ring-like shape centered at head passage 73 as viewed from above and extends in the up-down direction in such a shape as to surround the periphery of head passage 73 while being spaced away from head passage 73. Multiple positive pressure introduction passages 84 are formed in such a manner as to expand radially outwards of holder holding section 42b from a center axis side of holder holding section 42b, each positive pressure introduction passage 84 communicating with head passage 83. Each of multiple positive pressure introduction passages 84 is formed in such a manner as to correspond to each of multiple nozzle holders 65 and communicates with second gas passage 67a of corresponding nozzle holder 65. Multiple positive pressure introduction passages 84 are all formed in such a manner as to avoid negative pressure introduction passage 74 and spool hole 77. Frame passage 82, head passage 83, positive pressure introduction passage 84, and second gas passage 67a are all not in communication with any of frame passage 72, head passage 73, negative pressure introduction passage 74, atmosphere introduction passage 75, spool hole 77, and first gas passage 66a. That is, the negative pressure path of negative pressure and the positive pressure (atmosphere) path of negative pressure supply device 70 and the positive pressure path of positive pressure supply device 80 are independent of each other.

The interior of nozzle holder 65 and suction nozzle 60 will be described in detail by use of FIG. 4. FIG. 4A is a diagram showing a state where nozzle section 61 of suction nozzle 60 is not pushed in towards nozzle holder 65 (upwards in the figure), and FIG. 4B is a diagram showing a state where nozzle section 61 is pushed in by a predetermined amount towards nozzle holder 65. As shown in FIG. 4, suction nozzle 60 includes nozzle section 61, cylindrical section 62 having a larger diameter than that of nozzle section 61, and pin 63. Nozzle section 61 is a cylindrical body, and picks up component P through suction by supplying a negative pressure to nozzle section passage 61a in the interior in such a state that the suction port at the distal end (the lower end in the figure) is in contact with component P. Multiple nozzle section branch passages 61b are formed at the upper end of nozzle section 61. Nozzle section branch passage 61b is a through hole in the up-down direction and establishes communication between nozzle section passage 61a and the upper side of nozzle section 61. Multiple nozzle section branch passages 61b are formed circumferentially at equal intervals in a plan view. In FIG. 4, although two nozzle section branch passages 61b are shown, for example, four nozzle section branch passages 61b may be provided.

Although one or more nozzle section branch passages 61b need only be provided, multiple nozzle section branch passages 61b are preferably provided so as to facilitate the application of a negative pressure to the suction port at the distal end of nozzle section 61 from negative pressure source 71. Tubular section 62 is attached to the outer circumference of nozzle section 61 and has a flange section. The outside diameter of tubular section 62 is smaller than the inside diameter of a lower end portion of outer tube 66, and tubular section 62 and nozzle section 61 can be inserted into the interior of outer tube 66. Pin 63 passes through nozzle section 61 and tubular section 62 in the radial direction (left-right direction in FIG. 4). A pair of elongated holes, which are formed long along the up-down direction, is provided on nozzle section 61, and pin 63 penetrates the pair of elongated holes. Due to this, pin 63 can fluctuate along the elongated holes relative to nozzle section 61. As a result, pin 63 holds both nozzle section 61 and tubular section 62 so that both the sections are not dislocated from each other while permitting nozzle section 61 to fluctuate relative to tubular section 62.

Nozzle holder 65 has outer tube 66, inner tube 67 on the inner side of outer tube 66, spring 68, and valve 69. Inner tube 67 is inserted inside outer tube 66, and a space defined between the inner circumferential surface of outer tube 66 and the outer circumferential surface of inner tube 67, and the space so defined constitutes first gas passage 66a described above. First gas passage 66a extends in the up-down direction. First gas passage 66a constitutes a space provided in the interior of nozzle holder 65 so as to cause gas to flow in the up-down direction therein. Nozzle section 61 and tubular section 62 suction nozzle 60 are inserted into the interior of outer tube 66 from below. Tubular retaining member 66d and spring 66c configured to bias retaining member 66d downwards are attached to the outer side of outer tube 66. A slit is formed on outer tube 66 in such a manner as to extend upwards from the lower end of outer tube 66 and thereafter in a circumferential direction of outer tube 66. When suction nozzle 60 is attached to nozzle holder 65, suction nozzle 60 is turned in the circumferential direction after suction nozzle 60 is raised to cause tubular section 62 to be inserted in to the interior of outer tube 66. As a result, pin 63 moves upwards and circumferentially within the slit of outer tube 66 to reach the dead end of the slit, and suction nozzle 60 is attached to outer tube 66. In this state, retaining member 66d presses down pin 63 by means of the biasing force of spring 66c. As a result, retaining member 66d prevents pin 63 from being dislocated from the slit on outer tube 66 to thereby prevent suction nozzle 60 from being dislocated from outer tube 66. Outer tube 66 has leak hole 66b slightly above an attachment position of suction nozzle 60. Leak hole 66b constitutes a through hole that penetrates outer tube 66 horizontally (vertically in the up-down direction) and is opened to the exterior of outer tube 66. Leak hole 66b is formed in such a manner as to establish radial communication between the inner and the outer side of outer tube 66.

The inner space in inner tube 67 constitutes second gas passage 67a. Second gas passage 67a extends in the up-down direction. Second gas passage 67a constitutes a space provided in the interior of nozzle holder 65 in such a manner as to cause gas to flow in the up-down direction therein. Inner tube 67 has second gas passage 67a, flange section 67b, through hole 67c, protruding section 67d, and opening 67e. Flange section 67b is brought into abutment, in the up-down direction, with a portion on the inner circumferential surface of outer tube 66 where the inner circumferential surface is narrowed by one step radially, and engages with the portion. As a result, even though the biasing force of spring 68 is applied thereto, since inner tube 67 receives a downward reaction force from outer tube 66, outer tube 66 is prevented from moving upwards relative to inner tube 67. Multiple through holes 67c are formed circumferentially at equal intervals when seen from above, each through hole 67c constituting a hole that penetrates flange section 67b in the up-down direction. Although two through holes 67c are illustrated in FIG. 4, for example, four through holes 67c may be formed. By providing one or more through holes 67c, a portion lying above flange section 67b and a portion lying below flange section 67b communicate with each other in first gas passage 66a. Protruding section 67d constitutes a portion formed in such a manner as to project radially outwards below flange section 67b in inner tube 67b, and the lower surface of projecting section 67d is in abutment with the upper end of spring 68. Opening 67e is a through hole that horizontally (vertically in the up-down direction) penetrates inner tube 67, and is formed so as to establish a communication between second gas passage 67a in the interior of inner tube 67 and the outer circumferential surface side of inner tube 67. Opening 67a is formed in the vicinity of the dead end at the lower end of second gas passage 67a. Opening 67e is formed in such a manner as to establish communication between the inner side and the outer side of inner tube 67.

Valve 69 is a switching valve configured to switch between communication and non-communication of leak hole 66b of outer tube 66 with opening 67e of inner tube 67. Valve 69 constitutes tubular member having a space in the interior thereof, and the lower end of inner tube 67 is inserted into the interior in such a manner as to slide in the up-down direction. Valve 69 includes protruding section 69a, valve passage 69b, communication hole 69c, diameter reducing section 69d, and space 69e. Protruding section 69a constitutes a portion formed in such a manner as to protrude radially outwards of valve 69, and an upper surface of protruding section 69a is in abutment with spring 68. As a result, spring 68 is sandwiched by protruding section 67d of inner tube 67 and protruding section 69a of valve 69 from above and below, respectively, and is held thereat. As a result, spring 68 biases nozzle section 61 downwards via valve 69. More specifically, spring 68 biases nozzle section 61 downwards while permitting nozzle section 61 to be pushed in towards nozzle holder 65 (upwards in FIG. 4).

Valve passage 69b constitutes a hole that penetrates valve 69 in the up-down direction. Nozzle passage 69b communicates with first gas passage 66a at the upper end and communicates with nozzle section branch passage 61b at the lower end thereof. Valve passage 69b is formed in such a manner as to correspond to nozzle section branch passage 61b. First gas passage 66a communicates with nozzle section passage 61a by valve passage 69b and nozzle section branch passage 61b, whereby a negative pressure or a positive pressure (atmosphere) from first gas passage 66a is applied to the distal end of nozzle section 61. Communication hole 69c is a through hole that penetrates valve 69 horizontally (vertically in the up-down direction) and is formed in such a manner as to establish communication between the inner side and the outer side of valve 69. Communication hole 69c is formed in such a manner as to establish radial communication between the interior and the exterior of valve 69. Diameter-reducing section 69d constitutes a portion formed in such a manner as to narrow radially part of valve 69, causing a space generated on the outer circumferential surface side of valve 69 by narrowing diametrically valve 69 to communicate with communication hole 69c. Diameter-reducing section 69d is formed in such a manner as to have a predetermined length in the up-down direction according to a movable range of valve 69 so that leak hole 66b can be kept communicating with communication hole 69c even though valve 69 fluctuates in the up-down direction. Communication hole 69c and diameter-reducing section 69d are formed in such a manner as not to communicate with valve passage 69b. More specifically, valve passage 69b penetrates the position where communication hole 69c and diameter-reducing section 69d are not located and which lies away from them when seen from above in the up-down direction. In addition, communication hole 69c is formed in such a manner as to correspond to leak hole 66b and opening 67e so as to cause leak hole 66b to communicate with opening 67e. Although leak hole 66b, opening 67e, and communication hole 69c are shown as being provided in two for each in FIG. 4, they need only be provided in one or more for each, and hence, leak hole 66b, opening 67e, and communication hole 69c may be provided in four for each. Space 69e constitutes a space on a lower side of the lower end of inner tube 67 in such a state that valve 69 is not pushed in upwards. Space 69e is surrounded by an upper surface of nozzle section 61, the inner circumferential surface of valve 69, and the lower end of inner tube 67. Due to the presence of space 69e, valve 69 and nozzle section 61 can fluctuate in the up-down direction relative to inner tube 67.

Second gas passage 67a and opening 67e communicating therewith, communication hole 69c, diameter-reducing section 69d, and leak hole 66b do not communicate with any one of first gas passage 66a and through hole 67c communicating therewith, valve passage 69b, nozzle section branch passage 61b, and nozzle section passage 61a.

Here, switching between communication and non-communication of leak hole 66b with opening 67e by valve 69 will be described. For example, in picking up component P or mounting component P, when nozzle holder 65 is lowered by lifting and lowering device 50, nozzle section 61 is also lowered in association with the lowering of nozzle holder 65. Then, in a state where component P picked up and held nozzle section 61 or the distal end of nozzle section 61 is not in abutment with another member or where component P in question is in abutment with another member but is not pressing against the other member, valve 69 and nozzle section 61 is pressed downwards by the pressing force of spring 68, resulting in a state shown in FIG. 4A. FIG. 4A shows the state where component P picked up and held to nozzle section 61 is in abutment with board S but is not pressing against board S. In the state shown in FIG. 4A, since the position of communication hole 69c of valve 69 and the position of opening 67e deviate from each other in the up-down direction, valve 69 shuts off communication between leak hole 66b and opening 67e. Therefore, the positive pressure supplied from positive pressure source 81 is supplied to as far as second gas passage 67a, but gas does not flow out from second gas passage 67a. As a result, the gas does not flow into both gas passages of second gas passage 67a and positive pressure supply device 80.

On the other hand, in the state in FIG. 4A, when nozzle holder 65 is lowered further by lifting and lowering device 50, nozzle section 61 is pushed into nozzle holder 65 against the biasing force of spring 68. As a result, nozzle section 61 and valve 69 move upwards relative to outer tube 66 and inner tube 67. Due to this, communication hole 69c of valve 69 moves towards opening 67e of inner tube 67. Then, when a push-in amount of nozzle section 61 reaches a predetermined amount, communication hole 69c of valve 69 communicates with opening 67e (FIG. 4B). In this state, second gas passage 67a communicates with the exterior of outer tube 66 by way of opening 67e, communication hole 69c, diameter-reducing section 69d, and leak hole 66b. Due to this, the gas flows to leak hole 66b and the exterior thereof from positive pressure source 81 by means of the positive pressure supplied from positive pressure source 81. As described above, valve 69 switches between presence and absence of communication between second gas passage 67a and the exterior for the state where the push-in amount of nozzle section 61 does not reach the predetermined amount (for example, 4A) and the state where the push-in amount of nozzle section 61 reaches the predetermined amount (for example, 4B). Then, depending on whether second gas passage 67a communicates with the exterior, whether the gas flows through a gas passage (the gas passage from positive pressure source 81 to leak hole 66b) including second gas passage 67a changes. For this reason, in component mounter 10, whether the push-in amount of nozzle section 61 has reached the predetermined amount can be detected by detecting this change in gas flow rate by flow rate sensor 81a. Here, the "predetermined amount" is almost equal to the distance in the up-down direction between communication hole 69c and opening 67e in FIG. 4A.

As shown in FIG. 5, control device 90 is configured as a microprocessor made up, mainly, of CPU 91 and includes ROM 92, HDD 93, RAM 94, input and output interface 95, and the like, in addition to CPU 91. These are connected together by way of bus 96. An image signal from part camera 26, an image signal from mark camera, a detection signal from X-axis position sensor 37 for detecting the position of X-axis slider 32 in the X-axis direction, a detection signal from Y-axis position sensor 39 for detecting the position of Y-axis slider 34 in the Y-axis direction, a detection signal from Z-axis position sensor 53 for detecting the position of Z-axis slider 52 in the Z-axis direction, a detection signal from flow rate sensor 81a, and the like are inputted into control device 90 by way of input and output interface 95. On the other hand, a control signal to component supply device 20, a control signal to board conveyance device 24, a drive signal to XY robot 30 (X-axis motor 36 and Y-axis motor 38), a drive signal to mounting head 40 (R-axis motor 44, Q-axis motor 46, linear motor 51, spool driving mechanism 79), and the like are outputted from control device 90 by way of input and output interface 95.

Figure 6:
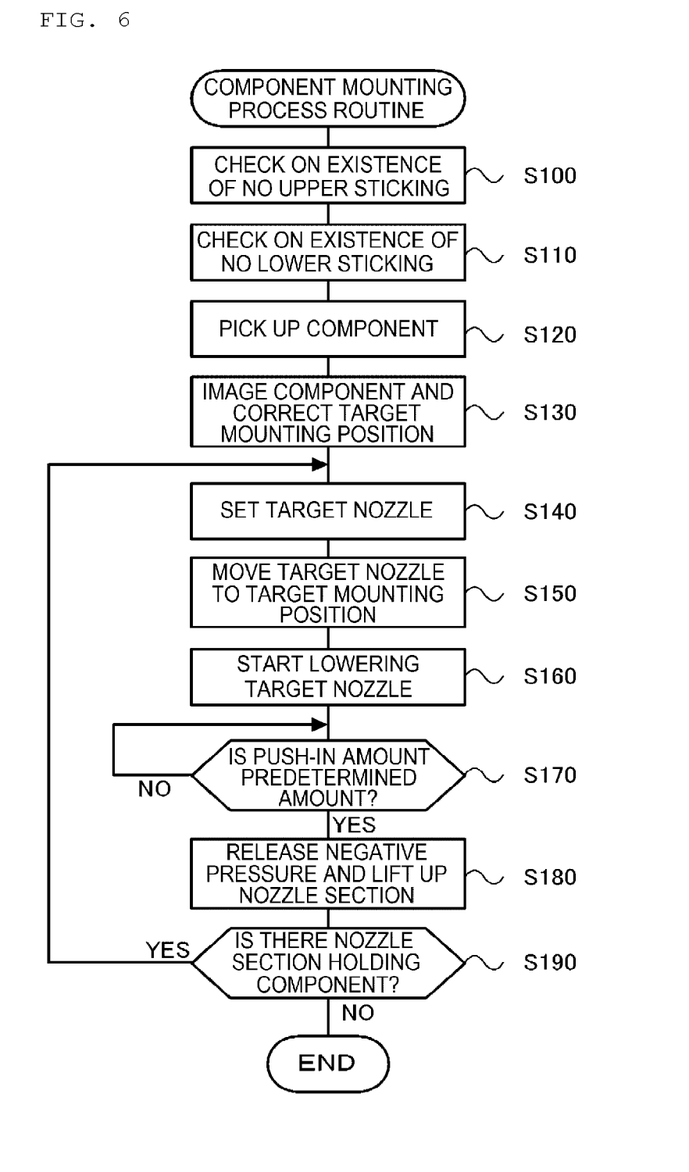
FIG. 6 is a flowchart showing an example of a component mounting process routine.

Next, the operation of component mounter 10 configured as described above, in particular, an operation thereof when component P is picked up and mounted on board S by mounting head 40 will be described. FIG. 6 is a flowchart showing an example of a component mounting process routine. Programs for CPU 91 to execute the routine in FIG. 6 are stored in, for example, HDD 93. CPU 91 executes a component mounting process when, for example, a mounting instruction including component data regarding components P to be mounted and target mounting positions thereof is issued from a management device (not shown).

When the component mounting process is started, CPU91 first performs a process of confirming or checking on a state where no upper sticking is occurring on suction nozzles 60 (step S100). Here, "sticking" means a state where at least one of upward and downward movements of nozzle section 61 of suction nozzle 60 fails. For example, a state where the outer circumferential surface of nozzle section 61 is caught on the inner circumferential surface of tubular section 62, and hence, nozzle section 61 cannot be lowered from a state where nozzle section 61 is lifted upwards relative to tubular section 62 is referred to as upper sticking. Similarly, a state where nozzle section 61 cannot be lifted up from a state where nozzle section 61 is lowered relative to tubular section 62 is referred to as lower sticking. In step S100, CPU 91 determines whether there is upper sticking by checking on a flow rate of gas detected by flow rate sensor 81a in such a state that any one of the distal ends of multiple nozzle sections 61 is not in contact with another member and based on whether the flow rate checked exceeds a predetermined threshold at which the push-in amount is considered to reach the predetermined amount. The gas passage from positive pressure source 81 to head passage 83 communicates with any one of second gas passages 67a of multiple nozzle holders 65. Therefore, by using flow rate sensor 81a provided between positive pressure source 81 and frame passage 82, CPU 91 can collectively determine whether upper sticking is occurring on which of multiple nozzle holders 65.

Next, CPU 91 performs a process of confirming that no lower sticking is occurring on suction nozzles 60 (step S110). In this case, CPU 91 moves mounting head 40 above reference member 17 and causes lifting and lowering device 50 to lower nozzle holder 65, which is in a lifting and lowering position. As a result, nozzle section 61 comes into contact with reference member 17 and is further pushed into nozzle holder 65. Then, when it lowers nozzle holder 65 by a height required for the push-in amount to reach the predetermined amount, CPU 91 determines whether the push-in amount has correctly reached the predetermined amount based on the flow rate detected by flow rate sensor 81a. If the push-in amount has correctly reached the predetermined amount (for example, the detected flow rate exceeds the predetermined threshold), CPU 91 determines that no lower sticking is occurring on pickup nozzle 60 of nozzle holder 65 in question. CPU 91 sequentially performs this process for all nozzle holders 65. Note that CPU 91 may determine whether there is lower sticking based on whether the flow rate detected by flow rate sensor 81a exceeds a predetermined threshold before a predetermined period of time elapses from the start of lowering of nozzle holder 65.

If CPU 91 determines in step S110 that upper sticking is occurring on suction nozzle 60 or determines in step S120 that lower sticking is occurring on suction nozzle 60, CPU 91 may inform the management device (not shown) or the operator that something abnormal is occurring on nozzle section 61 and end this routine.

If CPU 91 determines in steps S100 and S110 that no sticking is occurring on suction nozzles 60, CPU 91 moves mounting head 40 above component supply device 20 and causes each of multiple nozzle sections 61 to sequentially pick up component P (step S120). Here, CPU 91 causes lifting and lowering device 50 to lower nozzle holder 65, which is in a lifting and lowering position, causes spool drive mechanism 79 to switch spool 78 corresponding to nozzle holder 65 in question to apply a negative pressure to nozzle section 61 so nozzle section 61 picks up and holds component P to the distal end of nozzle section 61, and causes lifting and lowering device 50 to lift up nozzle section 61 thereafter. CPU 91 performs this process for nozzle sections 61 of all nozzle holders 65.

Next, CPU 91 moves each nozzle section 61, having picked up and holding component P above part camera 26, causes part camera 26 to image component P picked up and held, recognizes the position of component picked up and held based on the obtained image thereof, and corrects the target mounting position based on the recognized position (S130).

Next, CPU 91 sequentially mounts components P on board S. First, CPU 91 sets, from multiple nozzle sections 61, a target nozzle for mounting component P on board S next (step S140). Subsequently, CPU 91 moves the target nozzle to the target mounting position on board S (step S150) and causes lifting and lowering device 50 to start lowering the target nozzle (step S160). Then, CPU 91 waits until a flow rate detected by flow rate sensor 81a exceeds the predetermined threshold value, that is, until the push-in amount reaches the predetermined amount (step S170). When CPU 91 determines that the push-in amount has reached the predetermined amount, CPU 91 causes spool drive mechanism 79 to switch spool 78 corresponding to the target nozzle to apply a positive pressure (the atmosphere) to nozzle section 61 of the target nozzle to thereby release the negative pressure, and causes lifting and lowering device 50 to lift up nozzle section 61 (step S180). In this manner, CPU 91 releases the negative pressure applied to nozzle section 61 and then lifts up nozzle section 61 when CPU 91 determines based on the flow rate detected by flow rate sensor 81a that the push-in amount has reached the predetermined amount. As a result, component mounter 10 can mount component P on board S by pressing component P against board S with an appropriate pressing force. In addition, since CPU 91 releases the negative pressure applied to nozzle section 61 and then lifts up nozzle section 61 when the push-in amount reaches the predetermined amount, even though there exists an error in height on board S due to, for example, warping occurring on board S, CPU 91 can cause component P to be pressed against board S with a constant pressure irrespective of the magnitude of the error. Therefore, in component mounter 10, for example, a failure of releasing the holding of picked up component P before component P is pressed against board S can be prevented from occurring.

After step S180, CPU 91 determines whether there still remains nozzle section 61 holding component P (step S190), and if there still remains nozzle section 61 holding component P, CPU 91 sets nozzle section 61 in question as a subsequent target nozzle in step S140, and performs the processes from step S150 on. On the other hand, if CPU 91 determines in step S190 that there remains no nozzle section 61 holding component P, CPU 91 ends the component mounting process routine. CPU 91 may repeat this component mounting process multiple times based on a command from the management device. In component mounting processes from the component mounting process for the second time on, at least one of step S100 and step S110 may be omitted.

Here, the correspondence between the constituent components of the component mounter of the present embodiment and constituent components of a component mounter of the present disclosure will be described. Component mounter 10 of the present embodiment corresponds to a component mounter of the present disclosure, nozzle holder 65 corresponds to a base, lifting and lowering device 50 corresponds to a lifting and lowering device, suction nozzle 60 corresponds to a suction nozzle, spring 68 corresponds to a biasing section, valve 69 corresponds to a valve, and flow rate sensor 81a corresponds to a detecting device.

In component mounter 10 of the present embodiment that has been described heretofore, in mounting component P, when nozzle holder 65 is lowered by lifting and lowering device 50, nozzle section 61 is also lowered in conjunction with the lowering of nozzle holder 65. In addition, when nozzle holder 65 is further lowered in such a state that nozzle section 61 or component P picked up and held to nozzle section 61 is in abutment with another member (for example, reference member 17 or board S), nozzle section 61 is pushed in towards nozzle holder 65 against the biasing force of spring 68. Then, the communication of second gas passage 67a with the exterior is made or shut off depending on whether the push-in amount of nozzle section 61 has reached the predetermined amount. As a result, in component mounter 10, CPU 91 can determine whether the push-in amount has reached the predetermined amount by detecting a flow rate of gas flowing through second gas passage 67a using flow rate sensor 81a. Moreover, second gas passage 67a used in this determination does not communicate with first gas passage 66a to which a negative pressure is supplied. Due to this, for example, even though the state of nozzle section 61 differs or changes due to whether nozzle section 61 holds component P or the types of components P that nozzle section 61 holds, second gas passage 67a is hardly affected by the change. Therefore, in component mounter 10, whether the push-in amount of nozzle section 61 has reached the predetermined amount can be determined more accurately.

The present disclosure is not limited in any way to the embodiment that has been described heretofore, and the present disclosure can, needless to say, be carried out in various modes without departing from the technical scope of the present disclosure.

For example, in the embodiment described above, component mounter 10 is described as including flow rate sensor 81a configured to detect a flow rate of gas flowing through second gas passage 67a, but component mounter 10 may include a detecting device configured to detect at least one of a flow rate and a pressure.

In the embodiment described above, CPU 91 is described as determining whether the push-in amount of nozzle section 61 has reached the predetermined amount based on the flow rate detected by flow rate sensor 81a, but the present disclosure is not limited to this, and hence, for example, a push-in amount of nozzle section 61 may be detected based on the flow rate detected by flow rate sensor 81a. When nozzle section 61 is pushed in, communication hole 69c and opening 67e first communicate with each other slightly, and when nozzle section 61 is pushed in further, communication hole 69c and opening 67e communicate with each other further, facilitating the flow of gas. As a result, the flow rate detected by flow rate sensor 81a rises rapidly from a certain point in time. Therefore, for example, as long as the relationship between the rising amount and the push-in amount of nozzle section 61 at this time are linked and stored in advance in HDD 93, CPU 91 can detect a push-in amount of nozzle section 61 based on a flow rate detected by flow rate sensor 81a. In addition, CPU 91 may store or transmit a variation with time of flow rate detected by flow rate sensor 81a when nozzle section 61 is lowered in HDD 93 or to the management device, respectively. As a result, the operator can investigate the presence or absence of abnormalities or the cause for the abnormalities after the fact based on the variation with time of flow rate or to predict the occurrence of a problem based on deterioration with time.

In the embodiment described above, CPU 91 is described as determining whether the push-in amount of nozzle section 61 has reached the predetermined amount based on the flow rate detected by flow rate sensor 81a, but CPU 91 may determine whether the lowering distance of nozzle holder 65 at this time is normal. For example, when the push-in amount has reached the predetermined amount in step S170 in FIG. 6, CPU 91 may derive a lowering distance of nozzle holder 65 based on at least one of a lowering time and a control amount of linear motor 51 until then. In the case where the lowering distance derived by CPU 91 is greater or smaller than a permissible range where the lowering distance is considered to be normal (for example, a range resulting from a predetermined margin being added to a sum of the height of board S and the height of component S), CPU 91 may determine that the lowering distance is abnormal. By doing so, for example, in the case where board S is warped to an unacceptable extent, CPU 91 can assess this state as abnormal. In addition, in the case where nozzle section 61 picks up and holds no component P (=the lowering distance becomes greater than the permissible range), CPU 91 can assess this state as abnormal. For example, in the case where lower sticking occurs on nozzle section 61, CPU 91 can assess this state as abnormal.

In the embodiment described above, one lifting and lowering position where lifting and lowering device 50 can lift and lower nozzle holder 65 is described as being at one location, but two or more lifting and lowering positions may be provided individually at two locations. In the case where there are multiple lifting and lowering positions, as the number of nozzle sections 61 whose push-in amount has reached the predetermined amount increases, the flow rate detected by flow rate sensor 81a increases. Due to this, CPU 91 can determine whether the push-in amount has reached the predetermined amount for each of multiple nozzle sections 61 as long as the timing at which the push-in amount reaches the predetermined amount is set to spread among multiple nozzle sections 61 by causing the time at which multiple nozzle sections 61 are lowered to deviate or lowering multiple nozzle sections 61 towards mounting targets having different heights.

In the embodiment described above, flow rate sensor 81a is described as being provided between positive pressure source 81 and frame passage 82, but the present disclosure is not limited to this configuration. For example, flow rate sensor 81a may be disposed on positive pressure introduction passage 84, that is branched off towards multiple nozzle holders 65 from head passage 83, or downstream of positive pressure introduction passage 84, and associated with multiple nozzle holders 65 individually. This makes it possible to determine whether the push-in amount has reached the predetermined amount for each of nozzle sections 61. In addition, mounting head 40 need not include a detecting device such as flow rate sensor 81a for detecting at least one of a flow rate and a pressure of gas flowing through second gas passage 67a. It is sufficient to provide component mounter 10 with such a detecting device even if mounting head 40 does not include such a detecting device.

In the embodiment described above, the positive pressure is described as being supplied to second gas passage 67a, but the present disclosure is not limited to this configuration, and hence, a negative pressure may also be supplied to second gas passage 67a. Also in this case, since the flow rate detected by flow rate sensor 81a changes depending on whether the push-in amount of nozzle section 61 has reached the predetermined amount, CPU 91 can determine whether the push-in amount has reached the predetermined amount, as in the present embodiment.

In the embodiment described above, when the push-in amount of nozzle section 61 has reached the predetermined amount, it is determined that second gas passage 67a communicates with the exterior, but the present disclosure is not limited to this configuration. Valve 69 need only be able to switch between making or shutting off communication of second gas passage 67a with the exterior in the state in which the push-in amount of nozzle section 61 does not reach the predetermined amount and the state in which the push-in amount of nozzle section 61 reaches the predetermined amount. For example, the valve may be configured so that the valve makes the communication of second gas passage 67a with the exterior until the push-in amount of nozzle section 61 reaches the predetermined amount and shuts off the communication of second gas passage 67a with the exterior once the push-in amount reaches the predetermined amount.

In the embodiment described above, CPU 91 is described as not determining whether the push-in amount has reached the predetermined amount when nozzle section 61 is caused to pick up and hold component P, but that determination may be made when nozzle section 61 is caused to pick up and hold component P so that nozzle section 61 is pushed in to the predetermined amount.

In the embodiment described above, leak hole 66b is described as being provided so that the gas flows vertically in the up-down direction, but the present disclosure is not limited to this configuration, and leak hole 66b may also be provided so that the gas flows in the up-down direction, for example. In addition, with no leak hole 66b provided, communication hole 69c of valve 69 may be opened directly to the exterior.

In the embodiment described above, the opening to the exterior communicating with second gas passage 67a (here, leak hole 66b) is described as being disposed in nozzle holder 65, but the present disclosure is not limited to this configuration. For example, an opening to the exterior communicating with second gas passage 67a may be provided in suction nozzle 60.

In the embodiment described above, first gas passage 66a and second gas passage 67a are both described as being provided so that gas flows in the up-down direction, but the present disclosure is not limited to this configuration. For example, at least one of first gas passage 66a and second gas passage 67a may be provided so that gas flows vertically in the up-down direction.

In the embodiment described above, air is used as the gas that flows through first gas passage 66a and second gas passage 67a, but the present disclosure is not limited to this configuration. For example, positive pressure source 81 may supply an inert gas to second gas passage 67a, or the periphery of mounting head 40 may be in an inert gas atmosphere, and inert gas may be caused to flow through first gas passage 66a by means of a negative pressure.

In the embodiment described above, component mounter 10 is described as including multiple suction nozzles 60, but the number of suction nozzles 60 may consist of one suction nozzle 60.

The component mounter or the mounting head of the present disclosure may be configured as follows.

In the component mounter of the present disclosure or the mounting head of the present disclosure, the second gas passage may be a space provided so that gas flows in the up-down direction in the interior of the base.

In the component mounter of the present disclosure or the mounting head of the present disclosure, at least one of the base and the suction nozzle may have a leak hole provided so that gas flows vertically in the up-down direction and opened to the exterior, and the valve may switch between making and shutting off a communication between the second gas passage and the leak hole.

INDUSTRIAL APPLICABILITY

The present disclosure can be applied to a component mounter for mounting a component on a mounting target object such as a board.

REFERENCE SIGNS LIST

10 component mounter, 11 base, 12 housing, 17 reference member, 20 component supply device, 24 board conveyance device, 26 parts camera, 30 XY robot, 31 X-axis guide rail, 32 X-axis slider, 33 Y-axis guide rail, 34 Y-axis slider, 36 X-axis motor, 37 X-axis position sensor, 38 Y-axis motor, 39 Y-axis position sensor, 40 mounting head, 41 frame, 42 head main body, 42a shaft section, 42b holder holding section, 43 gear, 44 R-axis motor, 45 gear, 46 Q-axis motor, 47 gear, 50 lifting and lowering device, 51 linear motor, 52 Z-axis slider, 52a engagement section, 53 Z-axis position sensor, 60 suction nozzle, 61 nozzle section, 61a nozzle section passage, 61b nozzle section branch passage, 62 tubular section, 63 pin, 65 nozzle holder, 65a spring, 65b gear, 65c horizontal section, 66 outer tube, 66a first gas passage, 66b leak hole, 66c spring, 66d retaining member, 67 inner tube, 67a second gas passage, 67b flange section, 67c through hole, 67d protruding section, 67e opening, 68 spring, 69 valve, 69a protruding section, 69b valve passage, 69c communication hole, 69d diameter-reducing section, 69e space, 70 negative pressure supply device, 71 negative pressure source, 72 frame passage, 73 head passage, 74 negative pressure introduction passage, 75 atmosphere introduction passage, 77 spool hole, 78 spool, 79 spool drive mechanism, 80 positive pressure supply device, 81 positive pressure source, 81a flow rate sensor, 82 frame passage, 83 head passage, 84 positive pressure introduction passage, 90 control device, 91 CPU, 92 ROM, 93 HDD, 94 RAM, 95 input and output interface, 96 bus, P component, S board.

The invention claimed is:

1. A component mounter for mounting a component on a mounting target object, comprising:
    a mounting head comprising a base section having, in the interior thereof, a first gas passage and a second gas passage that does not communicate with the first gas passage;
    a lifting and lowering mechanism for lifting and lowering the base section;
    a suction nozzle having a nozzle section disposed below the base section and configured to be lifted up and lowered, as the base section is lifted up and lowered, to pick up the component through a negative pressure supplied to the first gas passage;
    a biasing section for biasing the nozzle section downwards while permitting the nozzle section to be pushed in towards the base section; and
    a valve for switching between absence of communication between the second gas passage and the outside when a push-in amount of the nozzle section has not yet reached a predetermined value and presence of communication between the second gas passage and the outside when the push-in amount of the nozzle section has reached the predetermined value; and
    a detecting device for detecting at least one of a flow rate or a pressure of gas flowing through the second gas passage.

2. The component mounter according to claim 1,
    wherein the second gas passage is a space provided to permit gas to flow in an up-down direction in the interior of the base section.

3. The component mounter according to claim 1,
wherein at least one of the base section and the suction nozzle has a leak hole, opened to the exterior, provided to permit gas to flow vertically in an up-down direction; and
wherein the valve switches between presence and absence of communication between the second gas passage and the leak hole.

* * * * *